(12) United States Patent
Kim

(10) Patent No.: US 9,774,180 B2
(45) Date of Patent: Sep. 26, 2017

(54) CIRCUIT BREAKER

(71) Applicant: LSIS CO., LTD., Anyang-si, Gyeonggi-do (KR)

(72) Inventor: Woong Jae Kim, Cheongju-si (KR)

(73) Assignee: LSIS CO., LTD., Anyang-si (KR)

( * ) Notice: Subject to any disclaimer, the term of this patent is extended or adjusted under 35 U.S.C. 154(b) by 346 days.

(21) Appl. No.: 14/704,641

(22) Filed: May 5, 2015

(65) Prior Publication Data

US 2015/0349513 A1      Dec. 3, 2015

(30) Foreign Application Priority Data

May 30, 2014   (KR) .................... 10-2014-0066318

(51) Int. Cl.

| | | |
|---|---|---|
| *H02H 3/16* | (2006.01) | |
| *H01H 1/62* | (2006.01) | |
| *H05K 7/20* | (2006.01) | |
| *H01H 9/52* | (2006.01) | |

(Continued)

(52) U.S. Cl.
CPC .............. *H02H 3/165* (2013.01); *H01H 1/62* (2013.01); *H01H 9/52* (2013.01); *H05K 7/20127* (2013.01); *H05K 7/20409* (2013.01); *H01H 1/226* (2013.01); *H01H 73/50* (2013.01)

(58) Field of Classification Search
CPC ............. H02H 3/165; H02H 1/62; H02H 9/52
See application file for complete search history.

(56) References Cited

U.S. PATENT DOCUMENTS

| | | | |
|---|---|---|---|
| 7,336,477 B2* | 2/2008 | Weister ................... | H01H 9/52 |
| | | | 165/104.33 |
| 2002/0030570 A1* | 3/2002 | Castonguay ......... | H01H 1/2058 |
| | | | 335/172 |

(Continued)

FOREIGN PATENT DOCUMENTS

| | | |
|---|---|---|
| CN | 101641756 | 2/2010 |
| CN | 103811237 | 5/2014 |
| EP | 2214189 | 8/2010 |

(Continued)

OTHER PUBLICATIONS

European Patent Office Application Serial No. 15166724.3, Search Report dated Oct. 26, 2015, 6 pages.

(Continued)

*Primary Examiner* — Scott Bauer
(74) *Attorney, Agent, or Firm* — Lee, Hong, Degerman, Kang & Waimey

(57) ABSTRACT

A circuit breaker according to the present invention includes a terminal switching unit mounted in an enclosure thereof, and the terminal switching unit accommodates, in a base as an outer casing thereof, a fixed contactor and a movable contactor contactable with and separated from each other, a sliding unit rotatably supporting the movable contactor, and a detection mechanism to detect a fault current. Radiators are provided at side portions of at least one of a contact portion where the movable contactor comes in contact with the fixed contactor, the sliding unit and the detection mechanism, each radiator radiating heat to the outside of the base. This may prevent an increase in temperature of the circuit breaker within a limited space without an increase in costs.

10 Claims, 11 Drawing Sheets

(51) Int. Cl.
    *H01H 1/22*           (2006.01)
    *H01H 73/50*        (2006.01)

(56)               References Cited

U.S. PATENT DOCUMENTS

| | | | |
|---|---|---|---|
| 2010/0282713 A1* | 11/2010 | Tu | H01H 33/6606 |
| | | | 218/118 |
| 2013/0062317 A1* | 3/2013 | Muders | H01H 9/342 |
| | | | 218/148 |

FOREIGN PATENT DOCUMENTS

| | | |
|---|---|---|
| EP | 2685481 | 1/2014 |
| EP | 2728598 | 5/2014 |
| JP | 07-041946 | 7/1995 |
| KR | 20-2012-0008678 | 12/2012 |
| KR | 20-2014-0002193 | 4/2014 |
| WO | 2008/116432 | 10/2008 |

OTHER PUBLICATIONS

State Intellectual Property Office of the People's Republic of China Application Serial No. 201510293850.X, Office Action dated Dec. 23, 2016, 5 pages.
Korean Intellectual Property Office Application Serial No. 10-2014-0066318, Office Action dated May 15, 2015, 4 pages.

\* cited by examiner

CIRCUIT BREAKER

CROSS-REFERENCE TO RELATED APPLICATION

Pursuant to 35 U.S.C. §119(a), this application claims the benefit of earlier filing date and right of priority to Korean Application No. 10-2014-0066318, filed on May 30, 2014, the contents of which are all hereby incorporated by reference herein in its entirety.

BACKGROUND OF THE DISCLOSURE

1. Field of the Disclosure

This specification relates to a circuit breaker, and more particularly, a circuit breaker capable of preventing an increase in temperature.

2. Background of the Disclosure

As generally known, a circuit breaker is a type of an electric apparatus for protecting load devices and circuits. The circuit breaker automatically breaks a circuit when it senses that an electric circuit is manually switched on or off or a fault current, such as a short-circuit current, occurs.

FIG. 1 is an exploded perspective view of the related art circuit breaker.

As illustrated in FIG. 1, the related art circuit breaker is configured such that a terminal switching unit 20 is mounted in an enclosure 10 thereof.

The terminal switching unit 20 includes a fixed contactor (not illustrated) and a movable contactor (not illustrated) that are contactable with or separated from each other within a base 30 as an outer casing of the terminal switching unit 20, a sliding unit (not illustrated) to rotatably support the movable contactor, and a detection mechanism 70 to detect a fault current.

With the configuration, in a normal state of the related art circuit breaker, the fixed contactor and the movable contactor are maintained in a closed state, such that currents can keep flowing. On the other hand, when a fault current occurs, the detection mechanism 70 opens (or separates) the movable contactor from the fixed contactor to perform a breaking operation.

However, in the related art circuit breaker, while a current normally flows, temperature increases in response to the flow of the current. When the temperature excessively increases, a mal-function of the circuit breaker may be caused or a user may be hurt. Of course, an additional installation of a cooling element, such as a cooling fan, may be taken into account to prevent the increase in the temperature of the circuit breaker. However, it may result in an increase in fabricating costs and a limitation of an installation space.

SUMMARY OF THE DISCLOSURE

Therefore, an aspect of the detailed description is to provide a circuit breaker capable of preventing an increase in temperature within a limited space without increased costs.

To achieve these and other advantages and in accordance with the purpose of this specification, as embodied and broadly described herein, there is provided a circuit breaker including an enclosure thereof, and a terminal switching unit mounted in the enclosure, wherein the terminal switching unit accommodates, in a base as an outer casing thereof, a fixed contactor fixed thereto, a movable contactor contactable with and separated from the fixed contactor, a sliding unit rotatably supporting the movable contactor, and a detection mechanism to detect a fault current. Radiators may be provided at side portions of at least one of a contact portion where the movable contactor comes in contact with the fixed contactor, the sliding unit and the detection mechanism. Each radiator may radiate heat to the outside of the base.

Radiators may be provided in a manner that sidewalls of the base and sidewalls of the enclosure are spaced apart from each other.

In accordance with one embodiment disclosed herein, each sidewall of the base may be configured such that an outer wall surface of a first portion thereof with the radiator provided thereon is more recessed than an outer wall surface of a second portion located at a periphery of the first portion.

In this embodiment, the outer wall surface of the second portion may be closely adhered on the enclosure of the circuit breaker, and the outer wall surface of the first portion may be spaced apart from the enclosure of the circuit breaker.

Each sidewall of the base may be configured such that an outer wall surface of a third portion located at one corner thereof is more recessed than the outer wall surface of the second portion and extends toward the outer wall surface of the first portion.

A flatness-securing protrusion may be provided at one side of the third portion. The flatness-securing protrusion may protrude from the outer wall surface of the third portion up to a height of the outer wall surface of the second portion.

In accordance with another embodiment disclosed herein, each sidewall of the enclosure of the circuit breaker may be configured such that an inner wall surface of a portion thereof with the radiator is more recessed than an inner wall surface of the other portion thereof.

In this embodiment, the inner wall surface of the other portion may be closely adhered on the base, and the inner wall surface of the portion with the radiator may be spaced apart from the base.

Meanwhile, a vent hole may be formed through the enclosure of the circuit breaker such that air flows therethrough. The vent hole may communicate with the radiator.

The vent hole may be formed in a shape of a slit long in a vertical direction.

The vent hole may be provided in plurality.

Further scope of applicability of the present application will become more apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure.

In the drawings.

DETAILED DESCRIPTION OF THE DISCLOSURE

Description will now be given in detail of preferred embodiments according to the present invention, with reference to the accompanying drawings.

Figure 3:
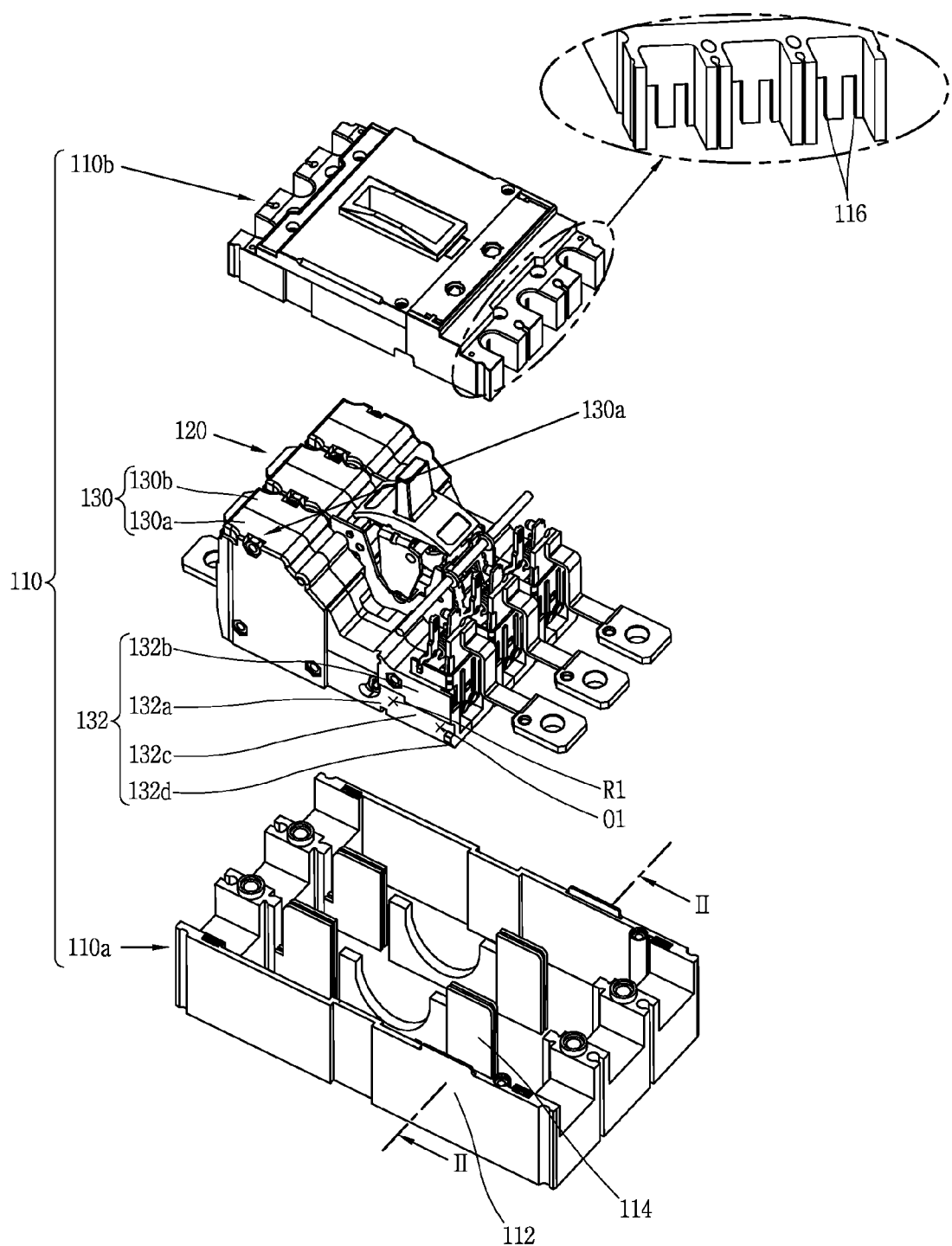
FIG. 3 is an exploded perspective view of a circuit breaker in accordance with one exemplary embodiment disclosed herein.

Prior to explaining the preferred embodiments of the present invention, on the basis of FIG. 3, a left direction refers to a front side, a right direction refers to a rear side, front and rear directions in the drawings refer to sides, an upper direction refers to an upper side, and a lower direction refers to a lower side.

Figure 4:
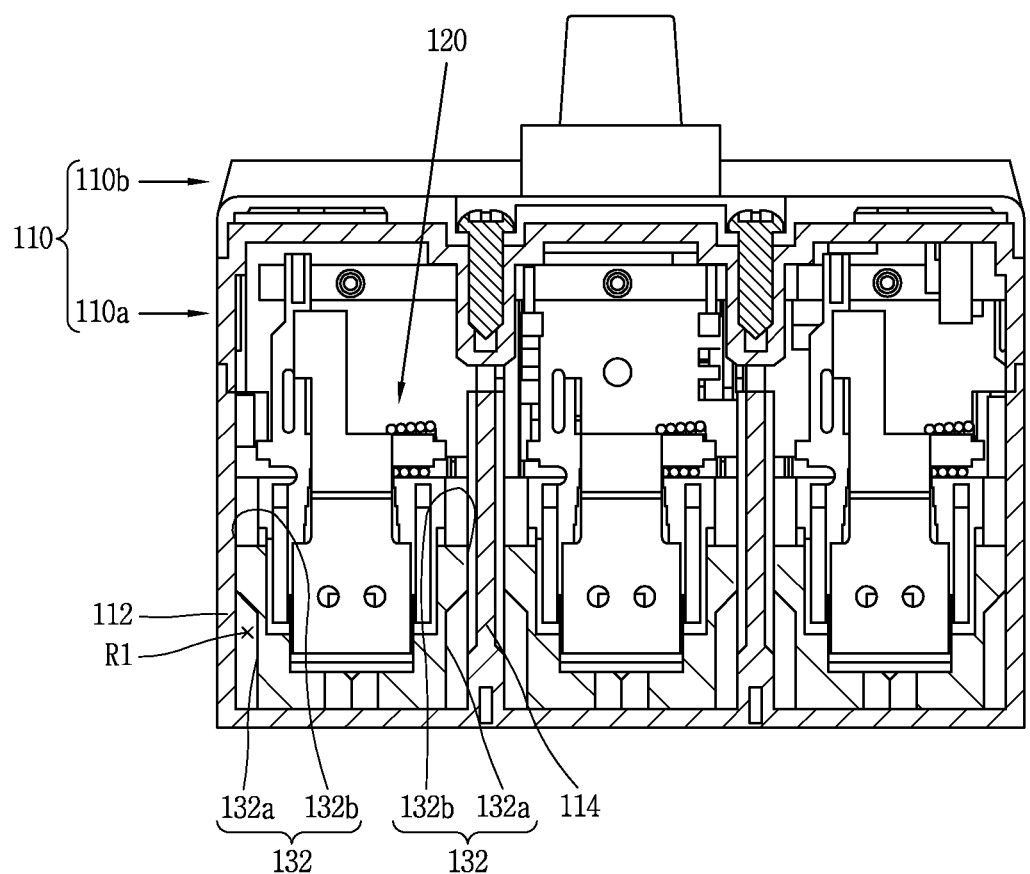
FIG. 4 is a sectional view taken along the line II-II, which illustrates an inner structure of the circuit breaker of FIG. 3 after being assembled.
Figure 5:
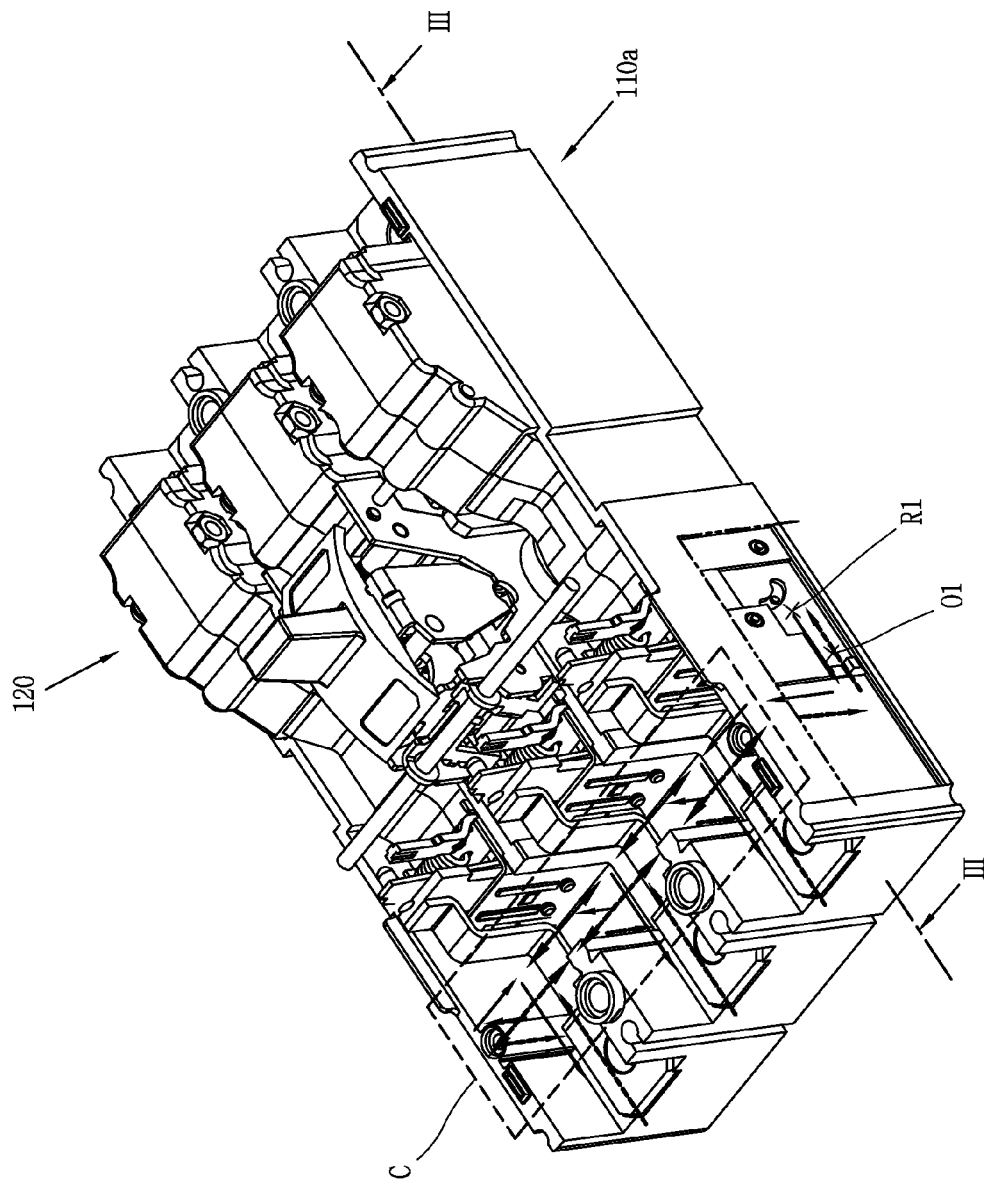
FIG. 5 is a perspective view illustrating a radiation path of the circuit breaker of FIG. 3.
Figure 6:
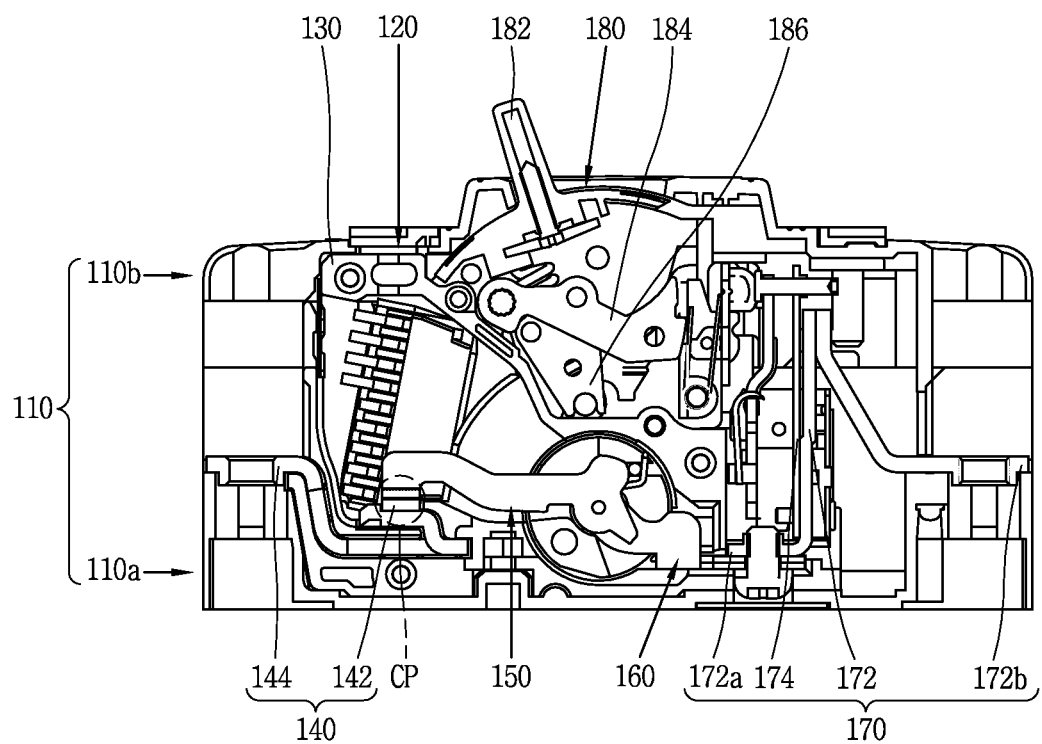
FIG. 6 is a sectional view taken along the line III-III of FIG. 5.
Figure 7:
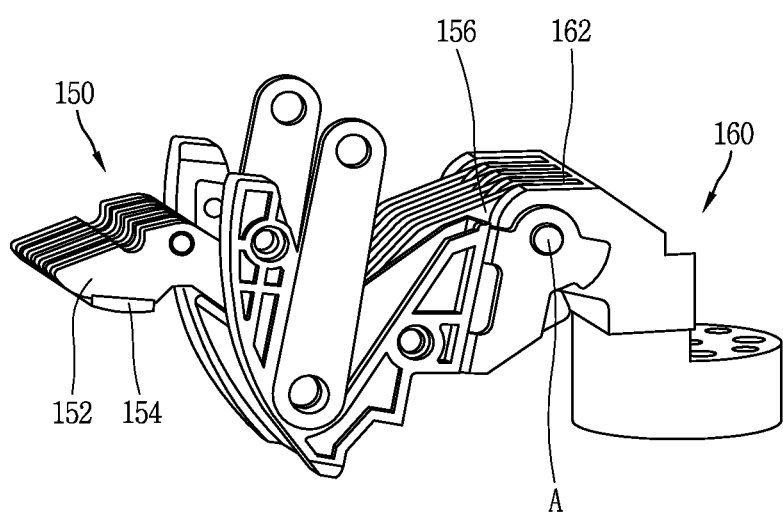
FIG. 7 is a perspective view illustrating a movable contactor and a sliding unit of FIG. 6.

FIG. 3 is an exploded perspective view of a circuit breaker in accordance with one exemplary embodiment disclosed herein, FIG. 4 is a sectional view taken along the line II-II, which illustrates an inner structure of the circuit breaker of FIG. 3 after being assembled, FIG. 5 is a perspective view illustrating a radiation path of the circuit breaker of FIG. 3, FIG. 6 is a sectional view taken along the line III-III of FIG. 5, and FIG. 7 is a perspective view illustrating a movable contactor and a sliding unit of FIG. 6.

As illustrated in FIGS. 3 to 7, a circuit breaker in accordance with one embodiment disclosed herein may include an enclosure 110, and a terminal switching unit 120 provided in the enclosure 110. The terminal switching unit 120 may be provided for each phase, and typically provided by three to correspond to each phase of three-phase alternating currents (AC).

The enclosure 110 may have a hollow rectangular shape which is formed by including a lower casing 110a in which the terminal switching unit 120 is accommodated, and an upper cover 110b covering the lower casing 110a. An inner space of the enclosure 110 may be provided with barriers 114 each interposed between the terminal switching units 120 which are provided for each phase. Each barrier 114 may serve as another sidewall of the enclosure 110 with respect to one terminal switching unit 120. Therefore, hereinafter, the barrier 114 is also referred as a sidewall of the enclosure.

The enclosure 110 of the circuit breaker may be configured in a manner that a length from front to rear sides of the inner space thereof is longer than a length from front to rear sides of the terminal switching unit 120. Accordingly, the front or rear side of the terminal switching unit 120 may be spaced apart from an inner wall surface of the front or rear side of the enclosure 110, so as to form a predetermined air circulation space C. The air circulation space C may communicate with a radiator R1 and a vent hole 116 to be explained later. According to the one embodiment, the enclosure 110 is longer than the terminal switching unit 120 in length and the air circulation space C is formed in the rear of the circuit breaker. However, it may also be possible that a height from top to bottom of the enclosure 110 is higher than a height from top to bottom of the terminal switching unit 120, such that the air circulation space C can be formed in an upper or lower side of the circuit breaker.

The terminal switching unit 120 may include a base 130, which is an outer casing of the terminal switching unit 120. The base 130 may accommodate therein a fixed contactor 140 fixedly installed therein, a movable contactor 150 contactable with or separated from the fixed contactor 140, a sliding unit 160 rotatably supporting the movable contactor 150, and a detection mechanism 170 connected to the sliding unit 160 to allow the flow of current and detect a fault current.

The fixed contactor 140 which is formed of a conductive material may be provided with a fixed contact 142 at one end portion thereof. The fixed contact 142 may be contactable with the movable contactor 150. The other end portion 144 of the fixed contactor 140 may be externally exposed to the front of the base 130 and the enclosure 110, so as to be connected to a power source or a load such that a current can flow therealong.

The movable contactor 150 which is formed of a conductive material may be provided with a plurality of contactor pieces 152, through which currents flow in a dividing manner so as to allow for the flow of a large amount of currents. A movable contact 154 which is contactable with the fixed contact 142 may be provided at one end portion of each contactor piece 152. The other end portion 156 of each contactor piece 152 may be rotatably coupled to the sliding unit 160 such that a current can flow.

The sliding unit 160 which is formed of a conductive material may be configured in a manner that a portion thereof coupled to the contactor pieces 152 is formed in a shape of a slit. That is, the sliding unit 160 may include a plurality of slits 162 in which the plurality of contactor pieces 152 are inserted, respectively. The plurality of contactor pieces 152 inserted into the plurality of slits 162 may be rotatably supported by a movable contactor rotation shaft A inserted therethrough. Each of the contactor pieces 152 may form a current-carrying path in a manner that both side surfaces thereof are closely adhered on the slit 162.

The detection mechanism 170 may include a heater 172 formed of a material which generates heat as a current flows therealong, and a bimetal 174 curved by the heat generated from the heater 172 so as to trip the movable contactor 150. The heater 172 may have one side 172a connected to the sliding unit 160 for a current to flow therealong, and the other side 172b externally exposed to the rear of the base 130 and the enclosure 110 to be connected to a load or a power source.

Meanwhile, the terminal switching unit 120 may further include a switching mechanism 180 opening and closing the movable contactor 150. The switching mechanism 180 may include a handle 182 protruding to an outside of the base 130 and the enclosure 110 to allow for a manual switching operation, a latch 184 unlocked by being pressed by the bimetal 174, a linkage member 186 to transfer a driving force generated by the handle 182 and the latch 184 to the movable contactor 150, and the like. The switching mechanism 180 is a well-known common technology, and description of which will thusly be omitted.

With the configuration, in a normal state, the circuit breaker may normally remain in a current-flowing state in a manner that the fixed contactor 140 and the movable contactor 150 are maintained in a closed state. Here, a current which is introduced from the power source side to the fixed contactor 140 may be supplied to the load side via the movable contactor 150, the sliding unit 160 and the heater 172. On the other hand, when a fault current occurs, the heater 172 may generate heat so as to heat up the bimetal 174. The bimetal 174 which has been heated up by the heater 172 may be curved and unlock the switching mechanism 180 accordingly. When the switching mechanism 180 is unlocked by the bimetal 174, the fixed contactor 140 and the movable contactor 150 are open from each other, thereby performing a breaking operation.

Here, when the circuit breaker is normally in the current-carrying state, the shapes and structures of the base 130 and the enclosure 110 of the circuit breaker may be important in view of temperature of the circuit breaker.

When a current normally flows in the circuit breaker, the flow of current may raise temperatures of components, which are accommodated in the terminal switching unit 120 so as to form a line. Accordingly, temperature of the base 130 increases, followed by an increase in temperature of the enclosure 130, thereby causing an increase in the entire temperature of the circuit breaker.

Figure 1:
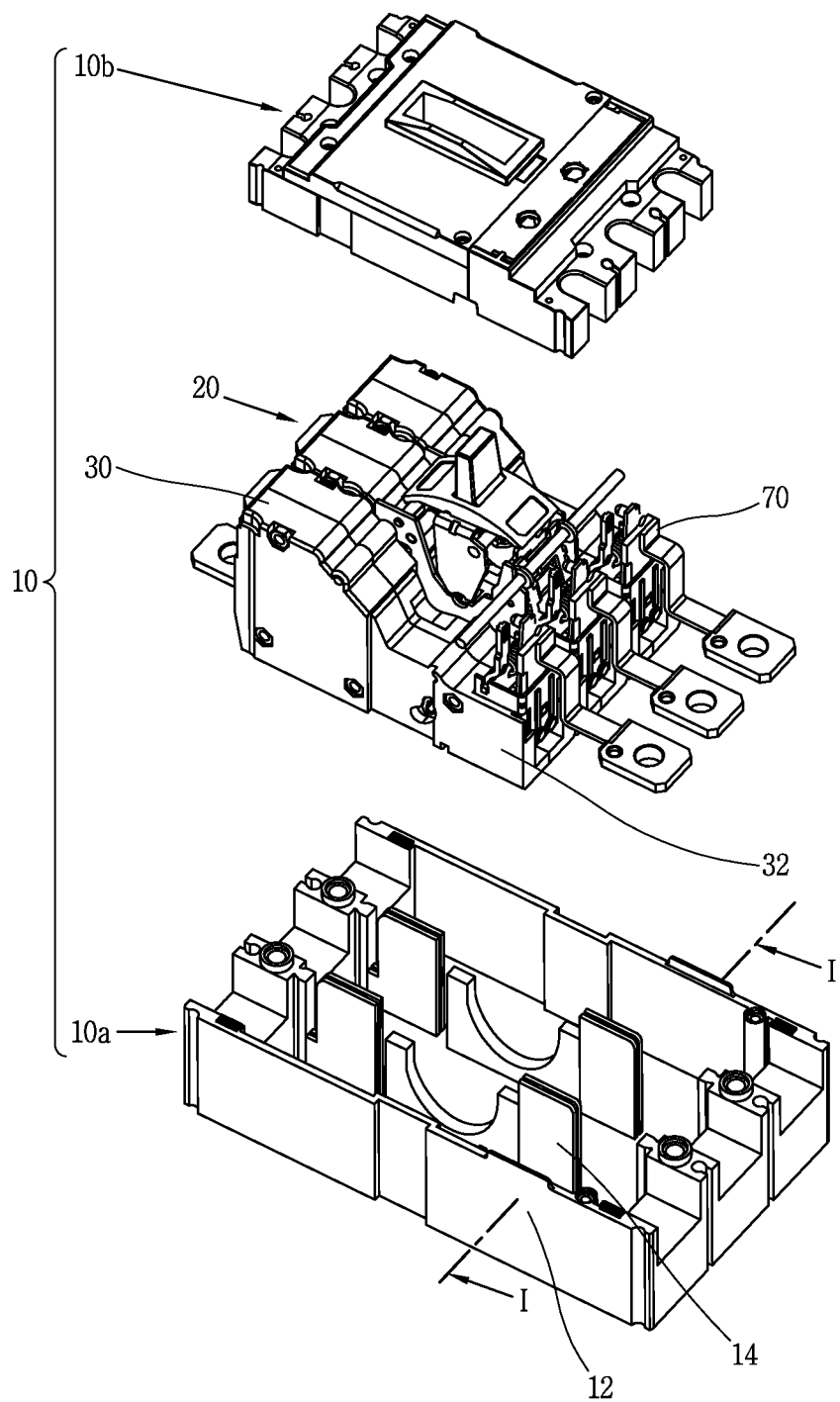
FIG. 1 is an exploded perspective view of the related circuit breaker.
Figure 2:
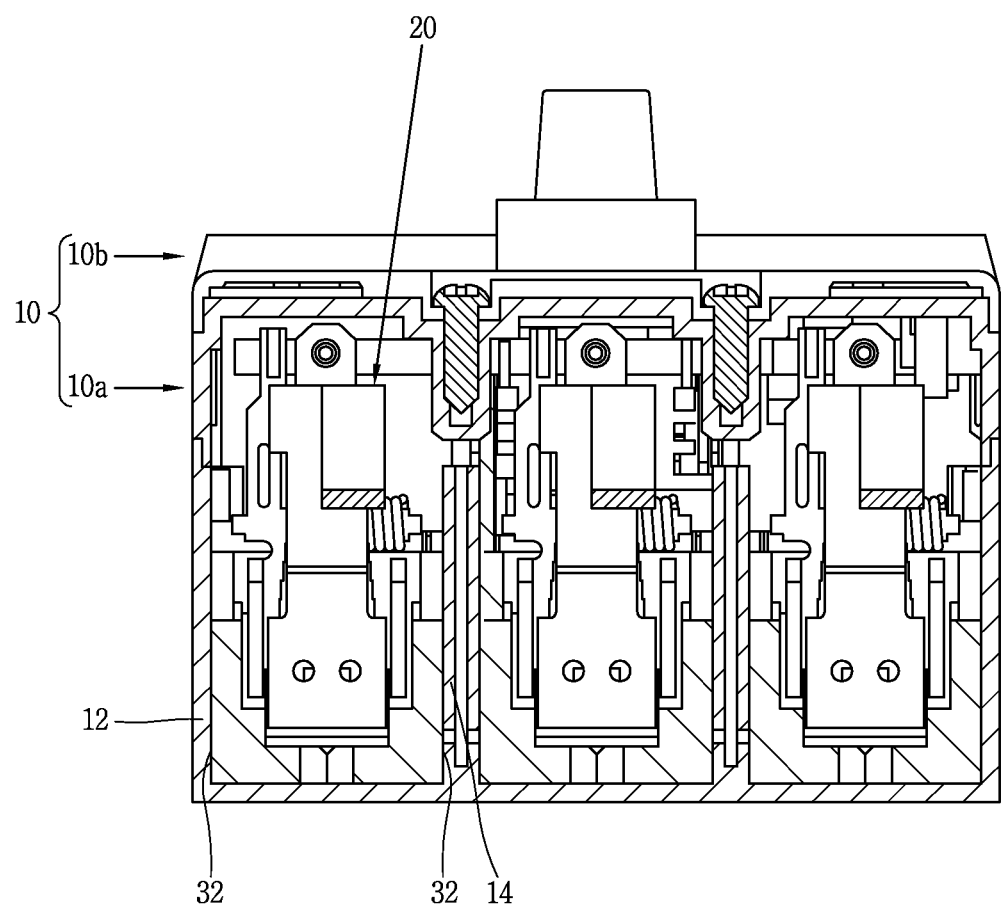
FIG. 2 is a sectional view taken along the line I-I, which illustrates an inner structure of the circuit breaker of FIG. 1 after being assembled.

However, according to analysis results of the related art circuit breaker, the related art circuit breaker, as illustrated in FIG. 2 which is a sectional view taken along the line I-I of FIG. 1, sidewalls 32 of the base are entirely closely adhered on sidewalls 12 and 14 of the enclosure. This causes a shortage of a radiation area of the base 30, which results in failing to cool the base 30. Accordingly, heat of the non-cooled base 30 is transferred to the enclosure 10 of the circuit breaker, thereby arousing an increase in the entire temperature of the circuit breaker. Therefore, in order to prevent the increase in the temperature of the circuit breaker, the base 30 should be cooled by increasing the radiation area of the base 30.

In addition, according to analysis results of a heat generation source of the circuit breaker, it has been recognized that a large amount of heat is specifically generated from a contact portion CP between the fixed contact 142 and the movable contact 154, the sliding unit 160 and the heater 172. The large amount of heat generated from the contact portion CP results from contact resistance between the fixed contact 142 and the movable contact 154. The large amount of heat generated from the sliding unit 160 results from contact resistance between the plurality of contactor pieces 152 and the plurality of slits 162, and the large amount of heat generated from the heater 172 results from the characteristic that the heater 172 is the very heat-generating member. Therefore, to prevent the increase in the temperature of the circuit breaker in an effective and efficient manner, the heat generated from the contact portion CP, the sliding unit 160 or the heater 172 should be cooled down.

Considering this point, in the exemplary embodiment disclosed herein, sidewalls 132 of the base 130 and sidewalls 112 and 114 of the enclosure 110, which are located at side portions of the sliding unit 160 and the heater 172, respectively, may be spaced apart from each other, with interposing therebetween radiators R1, which radiate heat from the base 130 to the outside of the base 130. Also, vent holes 116 through which air can flow in and out may be formed through the enclosure 110. The radiator R1 may communicate with the vent hole 116.

In more detail, each sidewall 132 of the base may be configured such that an outer wall surface 132a of a portion thereof, which is located at the side portion of the sliding unit 160 and the heater 172, is recessed more than an outer wall surface 132b of the other portion thereof. The outer wall surface 132b at the other portion of the sidewall 132 of the base 130 may be closely adhered onto the sidewall 112, 114 of the enclosure 110. The outer wall surface 132a at the portion of the sidewall 132 of the base 130, which is located at the side portion of the sliding unit 160 and the heater 172, may be spaced apart from the sidewall 112, 114 of the enclosure 110. Here, since the outer wall surface 132b of the other portion of the sidewall 132 of the base 130 may be closely adhered onto the sidewall 112, 114 of the enclosure, in order to reduce a size of the circuit breaker due to an increase in fabricating costs and a space limitation. That is, it may be advantageous, in terms of an increase in a radiation area, that the enclosure 110 of the circuit breaker is formed greater than that in the exemplary embodiment disclosed herein to make the entire sidewall 132 of the base 130 to be spaced apart from the enclosure 110. However, it may not be preferable because of the size limitation of the circuit breaker caused by the limited costs and space.

Meanwhile, there may be a case where the radiator R1 is hermetically sealed due to the close adhesion between the base 130 and the enclosure 110. That is, when the radiator R1 is surrounded by the adhered portion between the outer wall surface 132b of the other portion of the sidewall 132 of the base and the sidewall 112, 114 of the enclosure 110, the radiator R1 may not communicate with the vent hole 116. Hence, there is a requirement for an opening O1 for allowing communication between the radiator R1 and the vent hole 116. Considering this, in this embodiment disclosed herein, the outer wall surface 132a of the portion, which is located at the side portion of the sliding unit 160 and the heater 172, of the sidewall 132 of the base, may extend up to one corner of the sidewall 132 of the base. In other words, an outer wall surface 132c of the one corner of the sidewall 132 of the base may be formed more recessed than the outer wall surface 132b of the other portion of the sidewall 132. The outer wall surface 132c of the one corner of the sidewall 132 may extend toward the outer wall surface 132a of the portion, which is located at the side portion of the sliding unit 160 and the heater 172, of the sidewall 132 of the base. Accordingly, the radiator R1 may communicate with the air circulation space C through the opening O1, which is formed at the one corner of the sidewall 132 of the base, and then communicate with an external space of the enclosure 110 through the vent hole 116.

The vent hole 116 may be formed at one side of a rear wall portion of the lower upper case 110b, such that the air circulation space C located at the rear of the base 130 can communicate with an external space of the enclosure 110. Also, the vent hole 116 may be provided with an intake located at a lower side thereof and an outlet located at an upper side thereof, such that cold air can be smoothly introduced and hot air can be discharged therethrough by way of convection. In this embodiment disclosed herein, the vent hole 116 may be formed in the form of a slit which is long in a vertical direction (a direction from top to bottom of the circuit breaker). Here, the vertical direction may refer to a direction of the gravity. Also, the vent hole 116 may be formed thin enough to prevent an introduction of foreign materials. The vent hole 116 may be provided in plurality.

With the configuration, in this embodiment disclosed herein, cold external air which is introduced through the lower side of the vent hole 116 may be introduced into the radiator R1 via the air circulation space C and the opening O1. The cold air introduced in the radiator R1 may adsorb heat from the base 130. Hot air which is generated by adsorbing the heat may be discharged out of the enclosure 110 sequentially via the opening O1, the air circulation space C and the upper side of the vent hole 116. This may prevent the raise of temperature of the terminal switching unit 120, which may derive a prevention of the raise of the temperature of the enclosure 110, thereby lowering the entire temperature of the circuit breaker. Specifically, since surroundings of the sliding unit 160 and the heater 172 which generate relatively much heat are cooled, the increase in the temperature of the circuit breaker can be prevented in an effective and efficient manner. In such a manner, according to this embodiment disclosed herein, the radiation area can increase merely by the change in the shape of the base 130, and thus the increase in temperature of the circuit breaker can be prevented within a limited space without an increase in fabricating costs. This may result in preventing an occurrence of a malfunction of the circuit breaker and ensuring user's safety.

Meanwhile, in this embodiment disclosed herein, a flatness-securing protrusion 132d may be provided at one side of the opening O1. The flatness-securing protrusion 132d, as illustrated in this embodiment, is a component for preventing the base 130 from being inclined when the sidewall 132 of the base is laid down to come in contact with the ground for assembling the terminal switching unit 120, in case where the outer wall surface 132c of the one corner of the sidewall 132 of the base is recessed more than the outer wall surface 132b of the other portion of the sidewall 132. The base 130 may be provided with two pieces 130a and 130b divided in a vertical direction. Here, the terminal switching unit 120 may be assembled in a manner that components accommodated in the base 130 are mounted in one piece 130a while the one piece 130a of the base is laid down on the ground, and then the other piece 130b is engaged with (or covers) the one piece 130a. However, when the one corner of the sidewall 132 of the base 130 is recessed as illustrated in this embodiment disclosed herein, the one piece 130a of the base may be inclined with respect to the ground, which may interfere with the assembling of the terminal switching unit 120. Considering this problem, in the embodiment disclosed herein, the flatness-securing protrusion 132d may be formed at one side of the opening O1 by protruding from the outer wall surface 132c of the sidewall 132 up to a height of the outer wall surface 132b of the other portion of the sidewall 132. Accordingly, the terminal switching unit 120 may be easily assembled because the one piece 130a of the base 130 is not inclined with respect to the ground.

Figure 8:
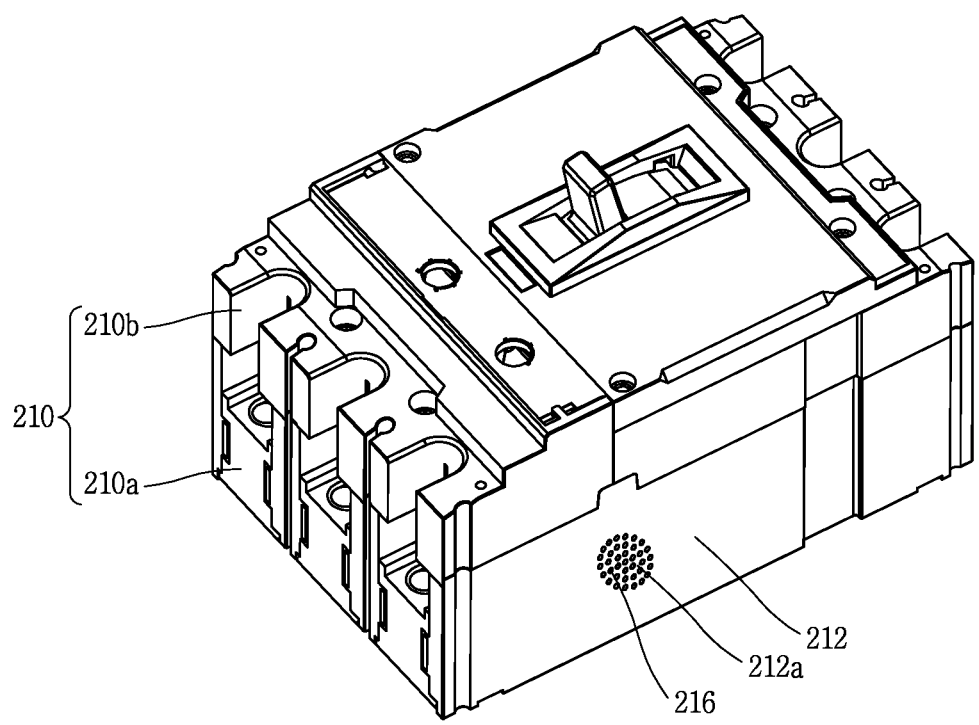
FIG. 8 is a perspective view of a circuit breaker in accordance with another exemplary embodiment disclosed herein.

FIG. 8 is a perspective view of a circuit breaker in accordance with another exemplary embodiment disclosed herein.

According to this embodiment illustrated in FIG. 8, the basic configuration and the operating effect are the same or similar to the previous embodiment. However, in this instance, a vent hole 216 may be formed through a portion 212a, which faces the radiator R1, of a sidewall 212 of a circuit breaker enclosure, so as to communicate directly with the radiator R1. Also, the vent hole 216 may be formed in a small circular shape to prevent an introduction of foreign materials, and be provided in plurality for smooth flow of air.

The same/like components and structures to the aforementioned embodiment will not be repeatedly described.

Figure 9:
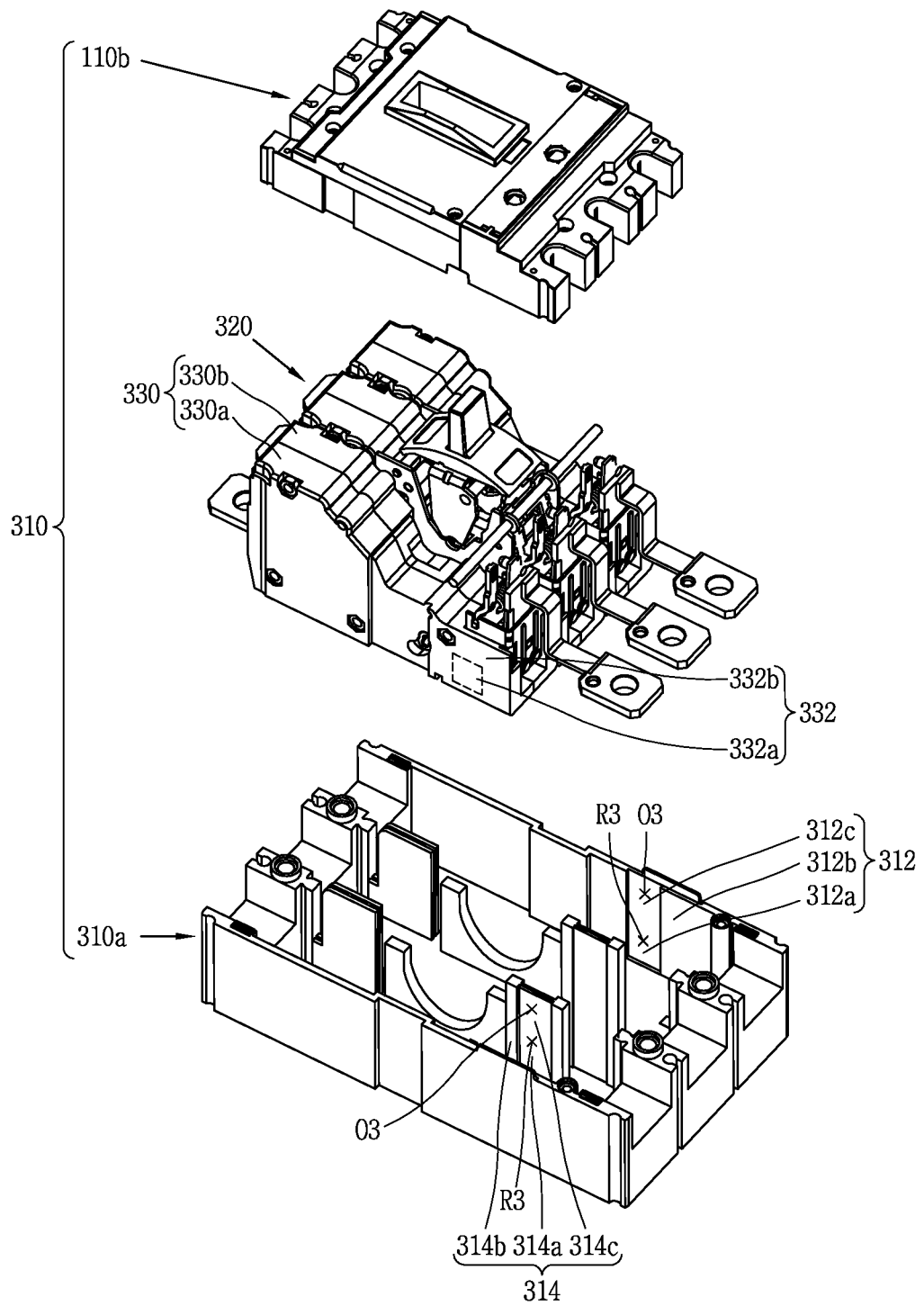
FIGS. 9, 10, 11 are exploded perspective views of circuit breakers in accordance with other exemplary embodiments disclosed herein.

FIG. 9 is an exploded perspective view of a circuit breaker in accordance with another embodiment disclosed herein.

This embodiment is the same or similar to the previous embodiment. However, in this instance, sidewalls 312 and 314 of an enclosure, other than sidewalls 332 of a base, may change in shape so as to mount radiators R3. In more detail, each sidewall 332 of the base may be configured such that an outer wall surface 332a of a portion thereof, which is located at the side portion of the sliding unit 160 and the heater 172, is not recessed more than an outer wall surface 332b of the other portion thereof. That is, the sidewall 332 of the base may be entirely formed flat. Rather, the sidewalls 312 and 314 of the enclosure of the circuit breaker may be configured such that inner wall surfaces 312a and 314a of portions thereof, which are located at the side portions of the sliding unit 160 and the heater 172, are recessed more than inner wall surfaces 312b and 314b of the other portions thereof. The inner wall surfaces 312b and 314b of the other portions, of the sidewalls 312 and 314 of the enclosure, may be closely adhered onto the sidewalls 332 of the base, and the inner wall surfaces 312a and 314a of the portions located at the side portions of the sliding unit 160 and the heater 172, of the sidewalls 312 and 314 of the enclosure, may be spaced apart from the sidewalls 332 of the base.

Also, in this embodiment, the radiators R3 may communicate with an upper side of the circuit breaker. That is, inner wall surfaces 312c and 314c of portions, which are located at upper portions of the radiators R3, of the sidewalls 312 and 314 of the enclosure, may be recessed such that openings O3 for communicating the radiators R3 with the air circulation space C are formed at the upper portions of the radiators R3.

The same/like components and structures to the aforementioned embodiment will not be repeatedly described.

Figure 10:
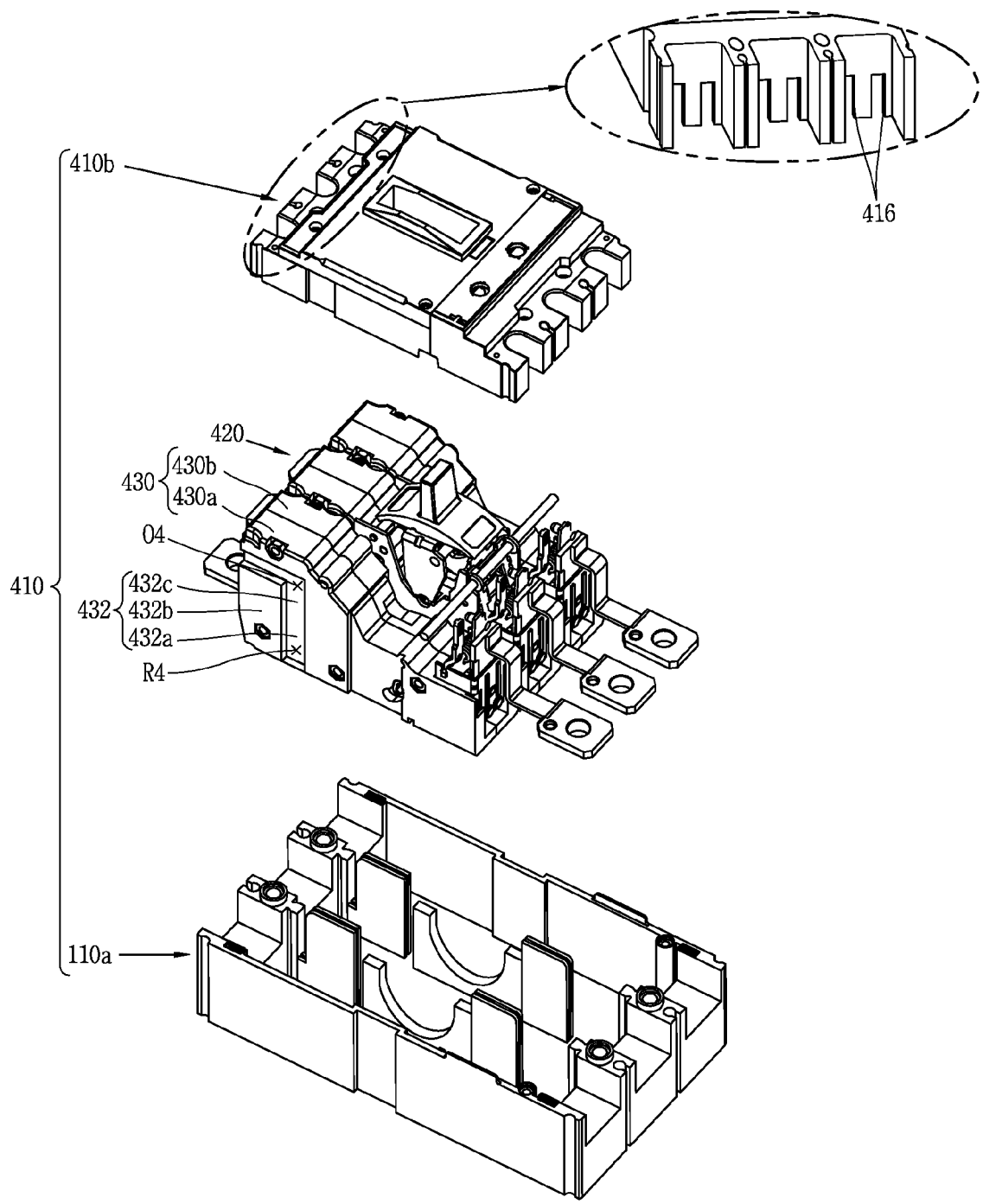

FIG. 10 is an exploded perspective view of a circuit breaker in accordance with another embodiment disclosed herein.

According to this embodiment illustrated in FIG. 10, the basic configuration and the operating effect are the same or similar to the previous embodiment. However, in this instance, a portion located at a side portion of the contact portion CP, of each sidewall 432 of the base, may change in shape, such that each radiator R4 can be provided at the side portion of the contact portion CP. In more detail, the sidewall 432 of the base may be configured such that an outer wall surface 432a of the portion thereof located at the side portion of the contact portion CP is more recessed than an outer wall surface 432b of the other portion thereof. The outer wall surface 432b of the other portion, of the sidewall 432 of the base, may be closely adhered on the sidewall 112, 114 of the enclosure, and the outer wall surface 432a of the portion located at the side portion of the contact portion CP, of the sidewall 432 of the base, may be spaced apart from the sidewall 112, 114 of the enclosure.

Also, in this embodiment, each radiator R4 may communicate with an upper portion of the circuit breaker. That is, an outer wall surface 432c of a portion, which is located at an upper portion of the radiator R4, of the sidewall 432 of the base, may be recessed such that an opening O4 can be formed at the upper portion of the radiator R4.

In this embodiment, a vent hole 416 may be formed on a front wall portion of an upper cover 410b. Here, the opening O4 can communicate directly with the vent hole 416, without a separate air circulation space C.

The same/like components and structures to the aforementioned embodiment will not be repeatedly described.

Figure 11:
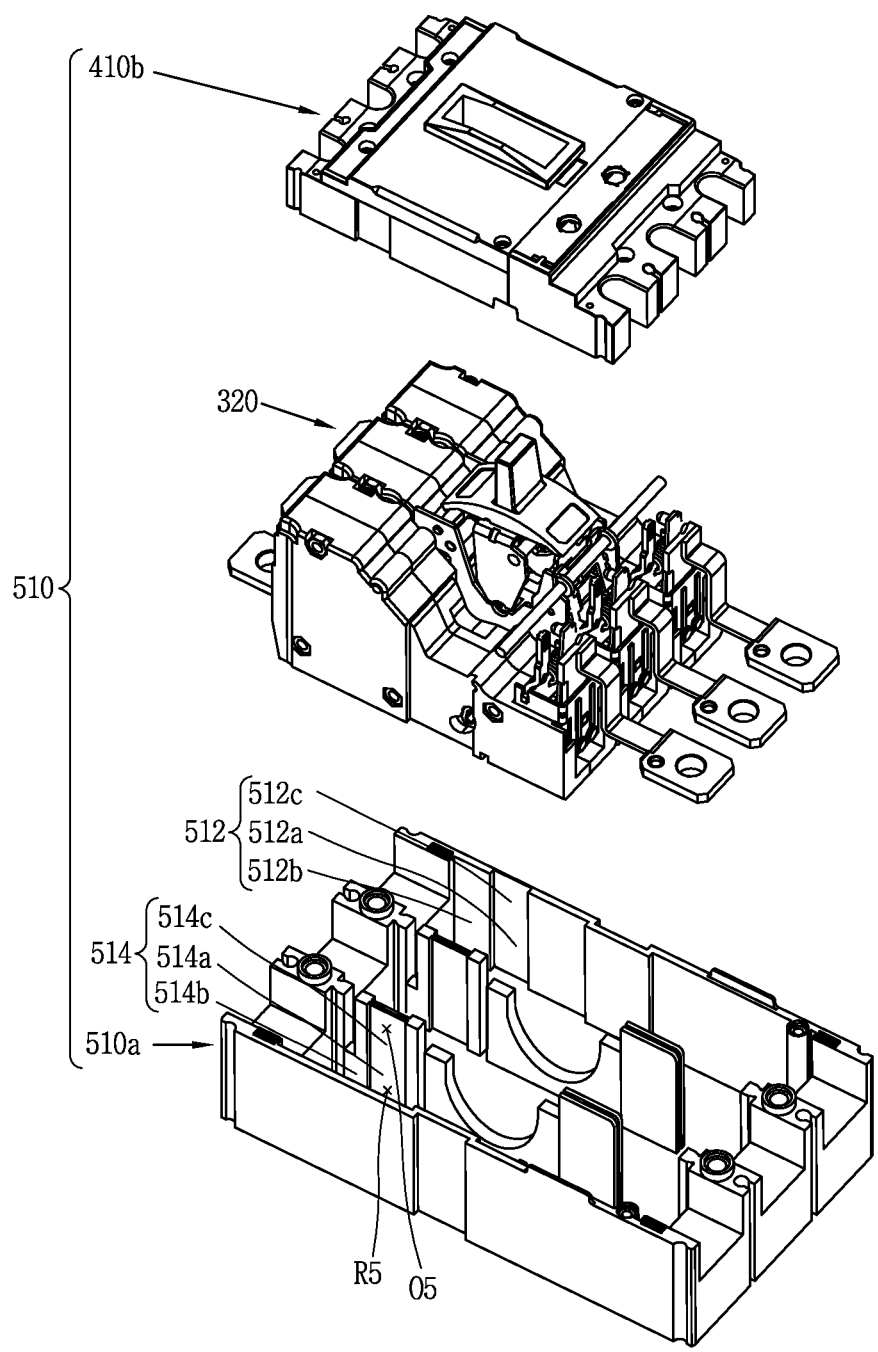

FIG. 11 is an exploded perspective view of a circuit breaker in accordance with another embodiment disclosed herein.

According to this embodiment illustrated in FIG. 11, the basic configuration and the operating effect are the same or similar to the previous embodiment. However, in this instance, portions of sidewalls 512 and 514 of the enclosure, located at side portions of the contact portion CP, may change in shape such that radiators R5 can be provided at the side portions of the contact portion CP. In more detail, the sidewalls 512 and 514 of the enclosure may be configured such that inner wall surfaces 512a and 514a of the portions located at the side portions of the contact portion CP are more recessed than inner wall surfaces 512b and 514b of the other portions. The inner wall surfaces 512b and 514b of the other portions, of the sidewalls 512 and 514 of the enclosure, may be closely adhered onto the sidewalls 332 of the base, and the inner wall surfaces 512a and 514a of the portions located at the side portions of the contact portion CP, of the sidewalls 512 and 514 of the enclosure, may be spaced apart from the sidewalls 332 of the base.

Also, in this embodiment, a radiator R5 may communicate with an upper portion of the circuit breaker. That is, each inner wall surface 514c and 514c of a portion located at an upper portion of each radiator R5 may be recessed such that an opening O5 can be formed on the upper portion of the radiator R5.

In this embodiment, the ventilator 416 may be formed on the front wall portion of the upper cover 410b. Here, the opening O5 can communicate directly with the vent hole 416, without a separate air circulation space C.

The same/like components and structures to the aforementioned embodiment will not be repeatedly described.

As described above, according to the present invention, a radiation area can increase by changing a shape of an enclosure of a circuit breaker or a base of a terminal switching unit, which is mounted in the enclosure of the circuit breaker. This may result in preventing an increase in temperature of the circuit breaker even without an increase in costs within a limited space.

The configurations and methods of the mobile terminal in the aforesaid embodiments may not be limitedly applied, but such embodiments may be configured by a selective combination of all or part of the embodiments so as to implement many variations.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A circuit breaker comprising:
   an enclosure thereof; and
   a terminal switching unit mounted in the enclosure,
   wherein the terminal switching unit accommodates, in a base as an outer casing thereof:
   a fixed contactor fixed thereto;
   a movable contactor contactable with and separated from the fixed contactor;
   a sliding unit rotatably supporting the movable contactor; and
   a detection mechanism to detect a fault current,
   wherein radiators are provided at side portions of at least one of a contact portion where the movable contactor comes in contact with the fixed contactor, the sliding unit and the detection mechanism, each radiator radiating heat to the outside of the base.

2. The circuit breaker of claim 1, wherein each sidewall of the base is configured such that an outer wall surface of a first portion thereof with the radiator provided thereon is more recessed than an outer wall surface of a second portion located at a periphery of the first portion.

3. The circuit breaker of claim 2, wherein the outer wall surface of the second portion is closely adhered on the enclosure of the circuit breaker, and the outer wall surface of the first portion is spaced apart from the enclosure of the circuit breaker.

4. The circuit breaker of claim 2, wherein each sidewall of the base is configured such that an outer wall surface of a third portion located at one corner thereof is more recessed than the outer wall surface of the second portion and extends toward the outer wall surface of the first portion.

5. The circuit breaker of claim 4, wherein a flatness-securing protrusion is provided at one side of the third portion, wherein the flatness-securing protrusion protrudes from the outer wall surface of the third portion up to a height of the outer wall surface of the second portion.

6. The circuit breaker of claim 1, wherein each sidewall of the enclosure of the circuit breaker is configured such that an inner wall surface of a portion thereof with the radiator is more recessed than an inner wall surface of the other portion thereof.

7. The circuit breaker of claim 6, wherein the inner wall surface of the other portion is closely adhered on the base, and the inner wall surface of the portion with the radiator is spaced apart from the base.

8. The circuit breaker of claim 1, wherein a vent hole is formed through the enclosure of the circuit breaker such that air flows therethrough, and
   wherein the vent hole communicates with the radiator.

9. The circuit breaker of claim 8, wherein the vent hole is formed in a shape of a slit long in a vertical direction.

10. The circuit breaker of claim 8, wherein the vent hole is provided in plurality.

* * * * *